United States Patent
Sharma et al.

(10) Patent No.: US 10,614,867 B2
(45) Date of Patent: Apr. 7, 2020

(54) PATTERNING OF HIGH DENSITY SMALL FEATURE SIZE PILLAR STRUCTURES

(71) Applicant: Spin Memory, Inc., Fremont, CA (US)

(72) Inventors: Gian Sharma, Fremont, CA (US); Amitay Levi, Cupertino, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 16/051,272

(22) Filed: Jul. 31, 2018

(65) Prior Publication Data
US 2020/0043537 A1     Feb. 6, 2020

(51) Int. Cl.
| | |
|---|---|
| H01L 29/66 | (2006.01) |
| G11C 11/16 | (2006.01) |
| H01L 43/10 | (2006.01) |
| H01L 43/08 | (2006.01) |

(52) U.S. Cl.
CPC ........ *G11C 11/161* (2013.01); *G11C 11/1659* (2013.01); *H01L 43/08* (2013.01); *H01L 43/10* (2013.01)

(58) Field of Classification Search
CPC ... G11C 11/161; G11C 11/1659; H01L 43/08; H01L 43/10
USPC .................................. 365/158; 438/669, 694
See application file for complete search history.

(56) References Cited

U.S. PATENT DOCUMENTS

| | | | | |
|---|---|---|---|---|
| 8,895,392 | B2* | 11/2014 | Kim ................... | H01L 21/02697 438/268 |
| 9,196,655 | B2* | 11/2015 | Park .................... | H01L 27/2454 |
| 9,257,305 | B2* | 2/2016 | Lee ..................... | H01L 21/76 |
| 9,634,240 | B2* | 4/2017 | Park .................... | H01L 43/08 |
| 9,685,484 | B1* | 6/2017 | Rabkin ............... | H01L 27/2481 |
| 10,192,788 | B1* | 1/2019 | Sharma ............. | H01L 29/78618 |
| 10,192,789 | B1* | 1/2019 | Sharma ............. | H01L 21/32053 |
| 10,333,063 | B1* | 6/2019 | Kim ..................... | H01L 43/12 |
| 10,347,822 | B1* | 7/2019 | Sharma ................. | H01L 43/02 |
| 10,355,047 | B1* | 7/2019 | Sharma ................ | H01L 27/228 |
| 10,388,862 | B1* | 8/2019 | Yang .................... | H01L 43/08 |

(Continued)

OTHER PUBLICATIONS

Jang et al., "Fabrication of MEMS devices by using anhydrous HF gas-phase etching with alcoholic vapor," Journal of Micromechanics and Microengineering, vol. 12, 2002, pp. 297-306.

*Primary Examiner* — Viet Q Nguyen
(74) *Attorney, Agent, or Firm* — Zilka-Kotab, P.C.

(57) ABSTRACT

A method for forming an array of very small pillar structures having a very small feature size that is smaller than the resolution limit of photolithographic process available for patterning such structures. The method involves forming an array of silicon pillar structures over a layer of material that will ultimately form the pillar structures. The array of silicon pillar structures is repeatedly oxidized to form a layer of silicon oxide at an outer surface of the silicon pillar structures and then etched to remove the outer layer of oxide, thereby reducing the features size (i.e. diameter) of the silicon pillar structure. A final oxidation process entirely oxidizes the remaining silicon pillar structures, leaving an array of small silicon oxide pillar structures that can be used as a mask for patterning underlying layers, including the underlying pillar material. The process is especially useful for forming an array of magnetic memory pillars.

6 Claims, 27 Drawing Sheets

(56) References Cited

U.S. PATENT DOCUMENTS

| | | | |
|---|---|---|---|
| 2002/0121662 A1* | 9/2002 | Rosner | B82Y 10/00 |
| | | | 257/329 |
| 2005/0127428 A1* | 6/2005 | Mokhlesi | H01L 27/115 |
| | | | 257/315 |
| 2009/0236658 A1* | 9/2009 | Gruening-von Schwerin | |
| | | | H01L 21/26586 |
| | | | 257/331 |
| 2010/0109061 A1* | 5/2010 | Kushida | H01L 27/228 |
| | | | 257/295 |
| 2012/0300557 A1* | 11/2012 | Kim | H01L 27/10876 |
| | | | 365/189.05 |
| 2013/0153998 A1* | 6/2013 | Song | H01L 27/228 |
| | | | 257/334 |
| 2013/0161710 A1* | 6/2013 | Ji | H01L 29/66666 |
| | | | 257/296 |
| 2015/0092481 A1* | 4/2015 | Lee | H01L 43/08 |
| | | | 365/158 |
| 2019/0348601 A1* | 11/2019 | Yang | H01L 43/08 |

* cited by examiner

PATTERNING OF HIGH DENSITY SMALL FEATURE SIZE PILLAR STRUCTURES

FIELD OF THE INVENTION

The present invention relates to magnetic random access memory (MRAM) and more particularly to a method for manufacturing high pitch pillar structures having a feature size that is smaller than photolithographic limits.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer are is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current and such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

In order to increase data density it is desirable to form magnetic recording elements at very small pitch, and high density. However, in order to avoid magnetic or electrical interference between adjacent magnetic elements it is also desirable to maintain a desired minimum spacing between magnetic recording elements. Therefore, to decrease pitch it is further desirable that the feature size of the magnetic recording element pillar structures be reduced. Photolithographic patterning methods can be used to pattern and define the critical dimensions of the magnetic element pillars. However, the resolution of such photolithographic processes is limited by physical properties, such as the wavelength of the light used to pattern the features. Therefore, there remains a need for a method for forming pillar structures at very small feature sizes and high pitch in order to increase data density.

SUMMARY

The present invention provides a method for manufacturing an array of pillar structures having a feature size smaller than the resolution limits of available photolithographic processes. A pillar material is deposited, and a layer of silicon is deposited over the pillar material. A mask structure including an array of patterned features is formed over the layer of silicon. A material removal process is performed to transfer the pattern of the mask structure onto the underlying silicon layer to form an array of silicon pillar structures. The silicon pillar structures are then oxidized to form an outer layer of oxide material on the silicon pillar structures, and an etching process is performed to remove the oxide, thereby reducing the size of the silicon pillar structures. The reduced size silicon pillar structures can then be used as a mask to pattern the underlying pillar material.

The process of oxidizing the silicon pillar structures and etching to remove the oxide can be performed repeatedly to further reduce the size of the silicon pillar structures. In addition, the process can be repeatedly performed until the silicon pillars have a sufficiently small size that a final oxidation process can entirely oxidize the remaining silicon, leaving an array of small, silicon oxide pillars. This array of silicon oxide pillars can then be used as a mask to pattern an underlying pillar material. This could be achieved by transferring the image of the array of silicon oxide pillars onto an underlying hard-mask layer, and then performing a material removal process such as reactive ion etching or some other suitable process to transfer the image of the patterned hard-mask onto the underlying pillar material.

This process can be advantageously applied to the formation of a high density magnetic random access memory array. In this case, the pillar material can be a series of layers that are configured to form magnetic memory elements, such as perpendicular tunnel junction magnetoresistive (pTMR) memory elements. This process can advantageously maximize density by making it possible to minimize the pitch of memory elements in the memory element array while also ensuring sufficient spacing between memory elements to avoid magnetic and electrical interference between the memory elements.

The patterning of the mask structure over the silicon layer can be performed using multiple photolighographic steps wherein each step is shifted relative to the previous step to create a close packed array of mask features.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
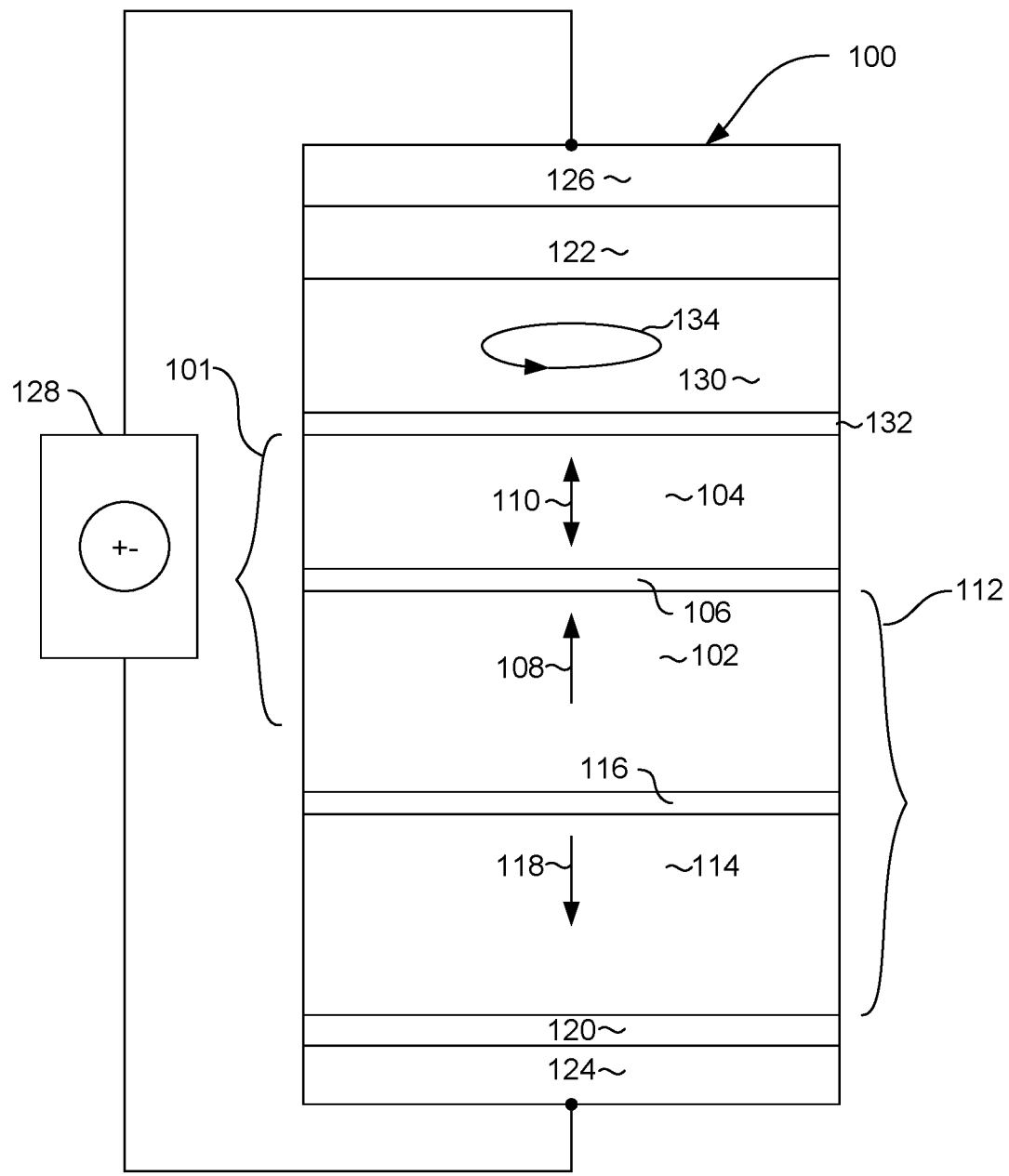
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Ta, W, and Al can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in a downward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in-plane direction (e.g. perpendicular to the magnetizations 110, 108 of the free and reference layers 104, 102. The magnetization 134, of the spin polarization layer 130 may either be fixed or can move in a precessional manner as shown in FIG. 1. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
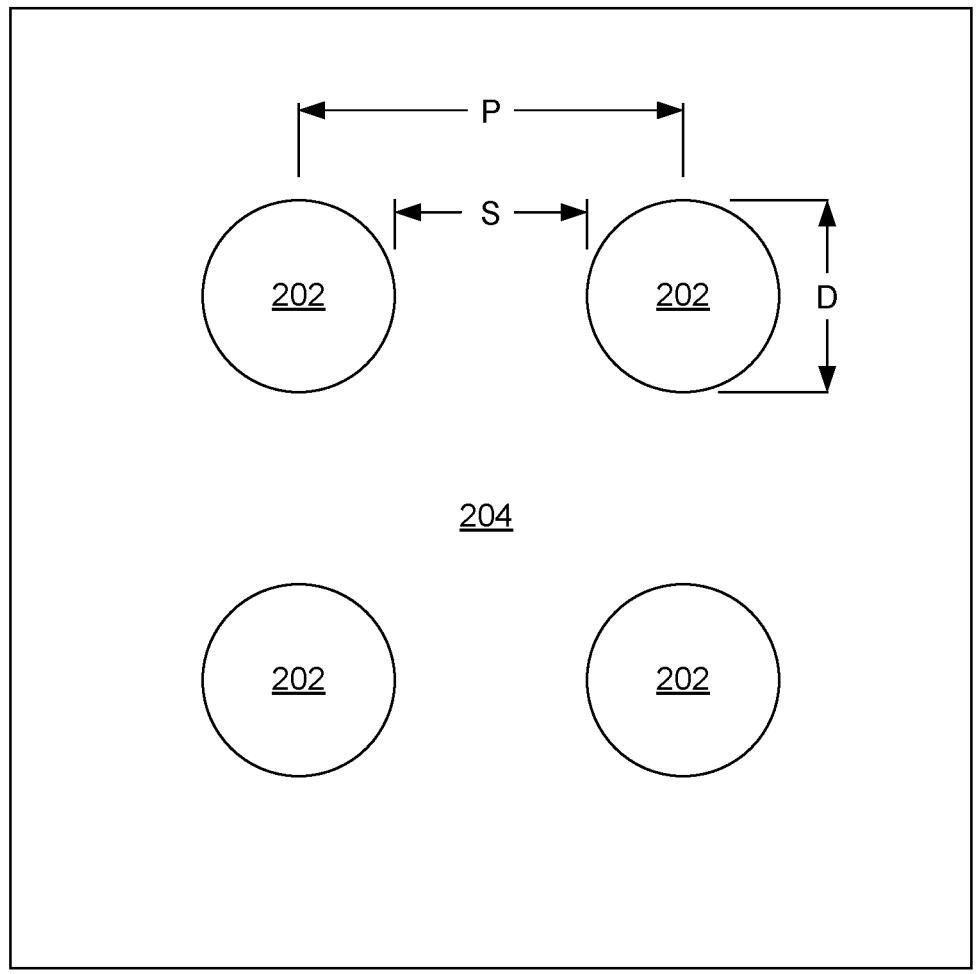
FIG. 2 is a top down view of an array of pillar structures which could be magnetic memory elements such as the memory element of FIG. 1.

FIG. 2 shows a top-down view of an array of pillar structures 202 surrounded by material 204. The pillar structures 202 could be magnetic memory elements such as the magnetic memory element 100 of FIG. 1, and the surrounding material 204 could be a dielectric isolation layer. The pillar structures 202 are separated by a center-to-center distance "P" that defines a pitch of the array of pillar structures 202. The spacing between the pillar structures 202 is represented by arrow "S", and the dimension of the pillar structures (e.g. the diameter) is represented by arrow "D". In a magnetic random access memory array, increasing data density requires minimizing the pitch of the memory element pillars 202. However, in order to prevent magnetic interference between magnetic element pillars 202 and also to prevent electrical shorting between magnetic element pillars 202 a certain minim spacing S between memory element pillars 202 must be maintained. In order to maintain the desired minimum spacing S at very small pitch P, the diameter D of the memory element pillars 202 can be reduced. However, the amount by which the features size (e.g. diameter D) can be reduced has been limited by the physical limits of photolithographic processes used to pattern the features. As those skilled in the art will appreciate, small scale elements such as semiconductors and memory element arrays can be patterned by a photolithographic process wherein a layer of photoresist is patterned by a stepper tool using a lens. The resolution of such processes is limited by physical properties such as the wavelength of light used in the photolithographic process.

The present invention provides a process for forming pillars 202 at dimensions D that are far smaller than the resolution limits of available photolithography. In addition, such a process allows the pitch P to be minimized while also ensuring a desired spacing S between elements 202 is maintained.

Figure 3:
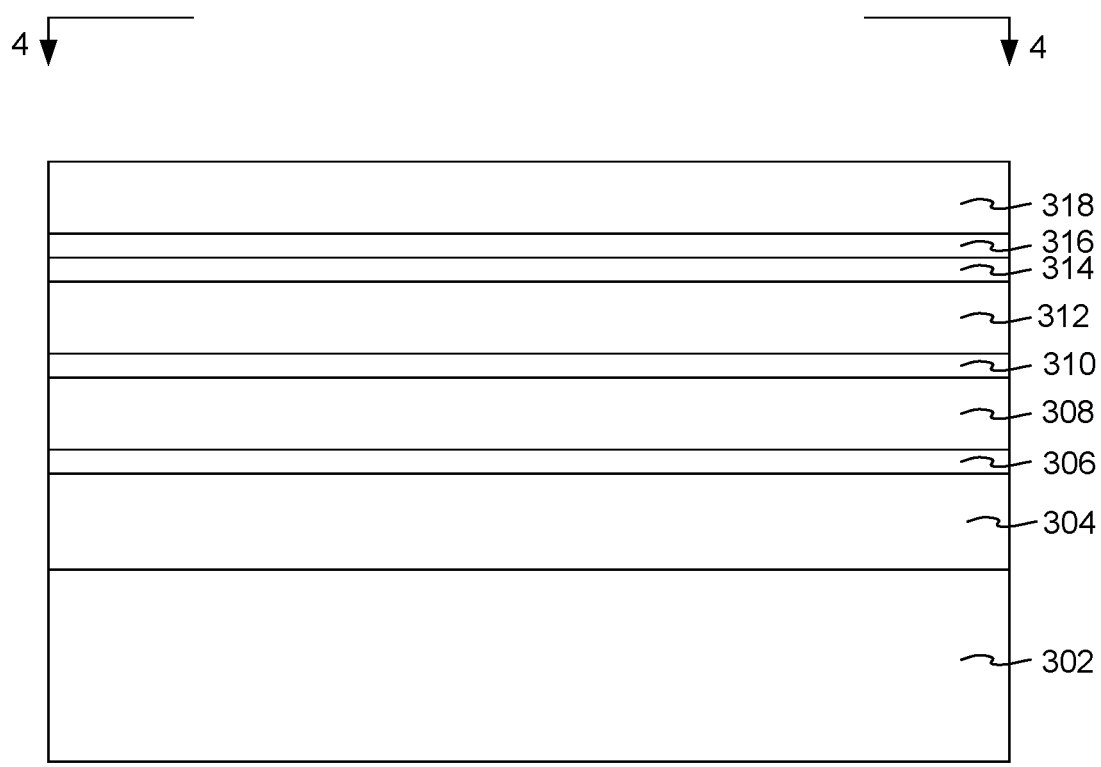
FIG. 3 is a cross sectional view of a series of layers such as could be used to construct an array of pillar structures such as an array of magnetic memory elements.

FIG. 3 shows a series of layers 300 that can be used in forming an array of pillar structures. The array of pillar structures 300 can include a substrate 302, which may include a silicon substrate and may also contain circuitry such as CMOS circuitry for processing data in a memory element and may also include an electrical contact (not shown). As the below described process can also be useful for forming small pillar structures in technologies other than magnetic random access memory, the substrate could be some other material or structure as well.

A layer of pillar material 304 is deposited over the substrate 302. The pillar structure could be a series of layers necessary to form magnetic random access memory elements such as the memory element 100 of FIG. 1, or could another material or series of layers of materials, and will be referred to herein generally as pillar material 304. An etch stop layer 306 can be deposited over the pillar material 304. The etch stop layer 306 can be a material such as Ru, or some other suitable material for providing an endpoint for an etching process that will be described herein below.

A hard mask layer 308 can be deposited over the etch stop layer 306. The hard-mask 308 can be a material that can be patterned by an etching process such as reactive ion etching and can also be resistant to reactive ion milling for reasons that will be apparent herein below. For example, the hard-mask layer 308 can be formed of TaN. An optional etch stop layer such as SiN 310 can be formed over the hard-mask layer 308. A layer of Si 312 is then deposited over the layers 302, 304, 306, 308, 310. The Si layer 312 will provide an oxide mask as will be seen.

With continued reference to FIG. 3, hard mask layer 314 can be deposited over the Si layer 312. The hard mask layer 314 can be a material such as SiN. An optional Bottom Anti-Reflective Coating (BARC) such as DURAMIDE® 316 can be deposited over the hard mask layer 314 and Si layer 312, and a layer of photoresist 318 is deposited over the BARC layer 316.

Figure 4:
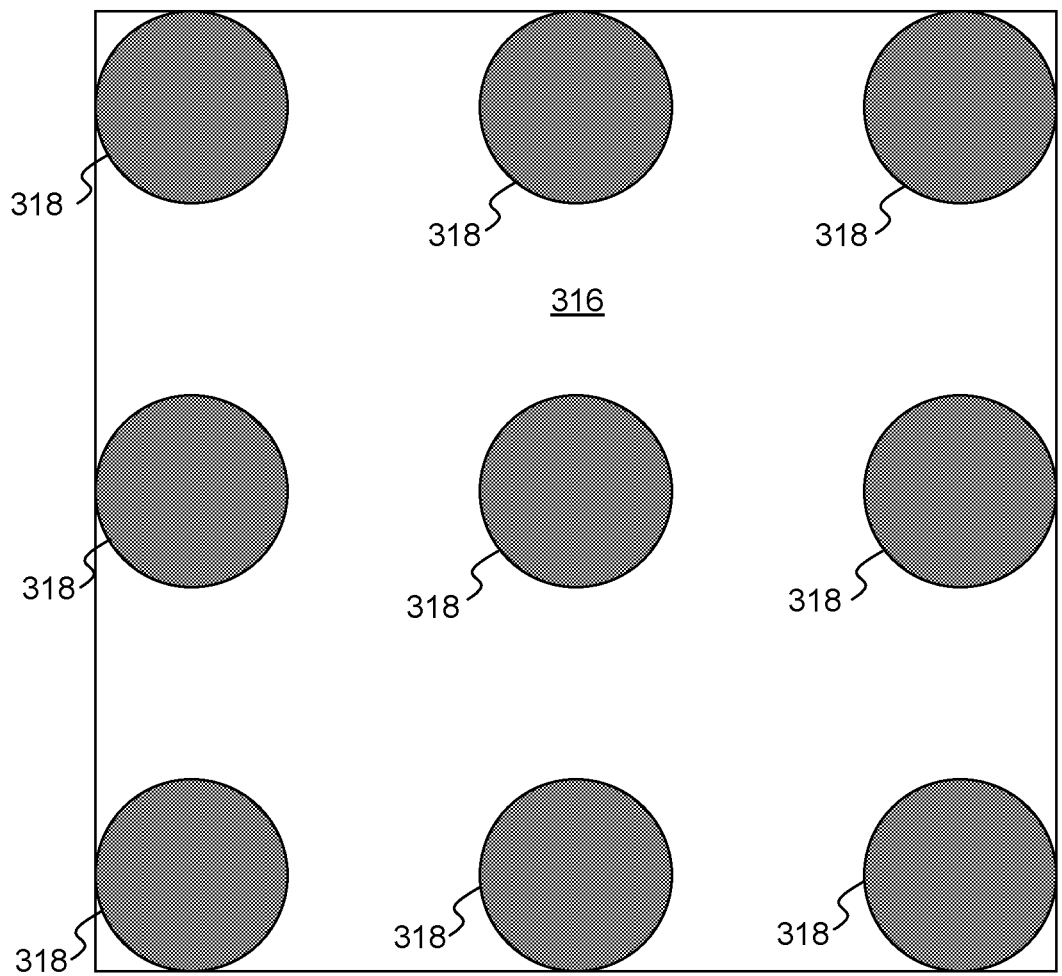
FIG. 4 is a top down view of a patterned mask array after a first patterning step.
Figure 8:
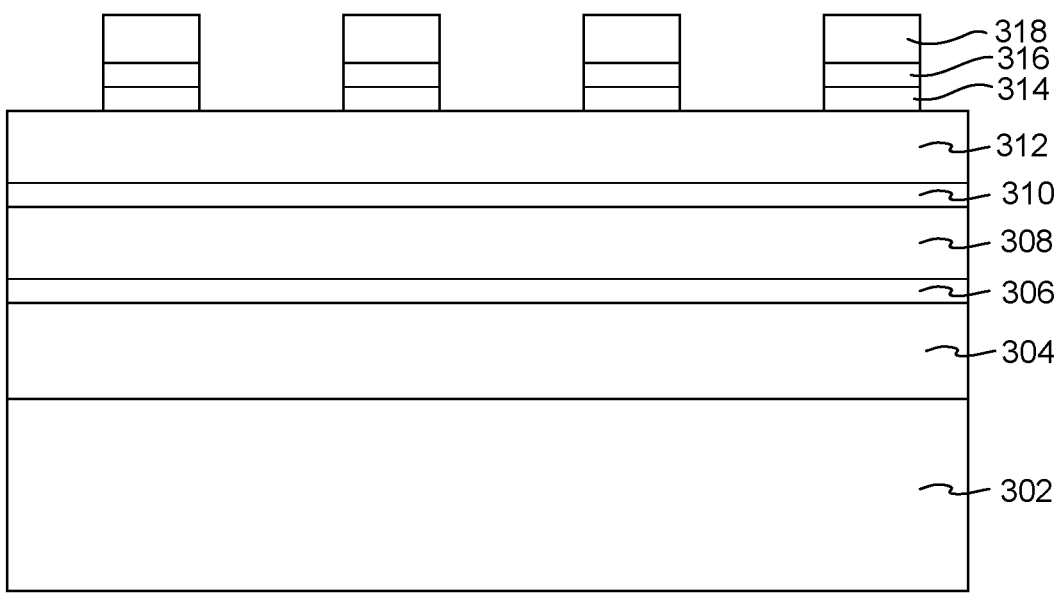
FIG. 8 is a side cross-sectional view of the series of layers after the first patterning step and after an etching process.
Figure 9:
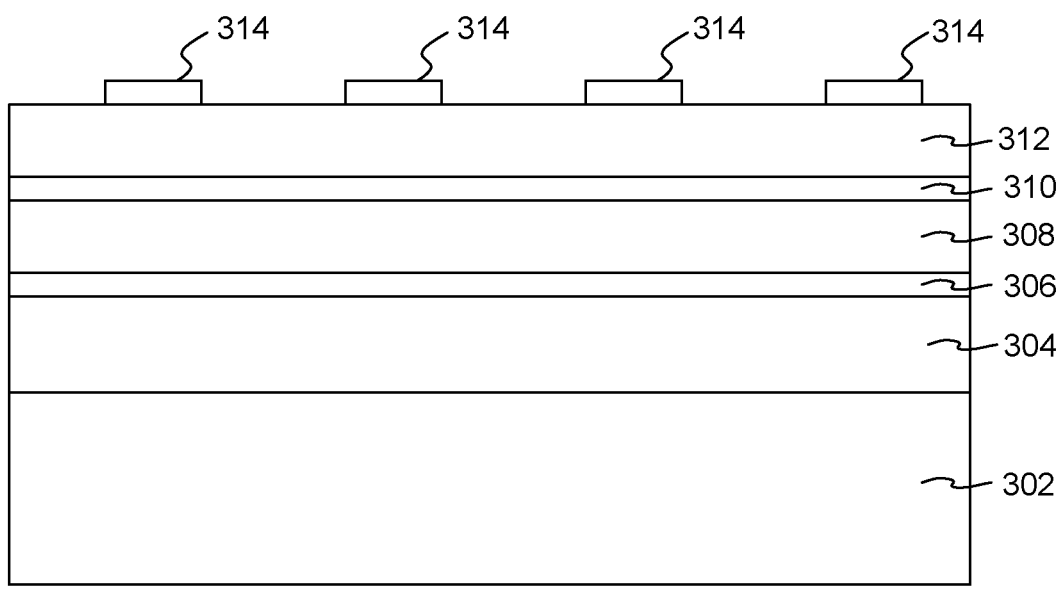
FIG. 9 is a side cross-sectional view of the series of layers after the first patterning step and after removal of a first photoresist mask.

A series of masking and etching steps can then be performed to form a hard mask structure of a pattern of mask elements (e.g. circular mask elements) having a tight spacing and small pitch. FIG. 4 shows a top down view as seen from line 4-4 of FIG. 3. In a first patterning process. The photoresist layer 318 is photolithographically patterned to form an array of photoresist mask elements as shown. Then, an etching process can be performed to transfer the image of the photoresist mask 318 onto the underlying BARC 316 and hard mask layer 314 (e.g. SiN layer 314). This can be seen more clearly with reference to FIG. 8 which shows a cross-sectional view as seen from line 8-8 of FIG. 4. The first photoresist mask 318 and BARC layer 316 can then be removed, leaving a structure such as that shown in FIG. 19. As can be seen in FIG. 9, the remaining layer 314 forms a hard mask, and this hard mask has a shape as defined by the mask 318 of FIG. 4.

Figure 5:
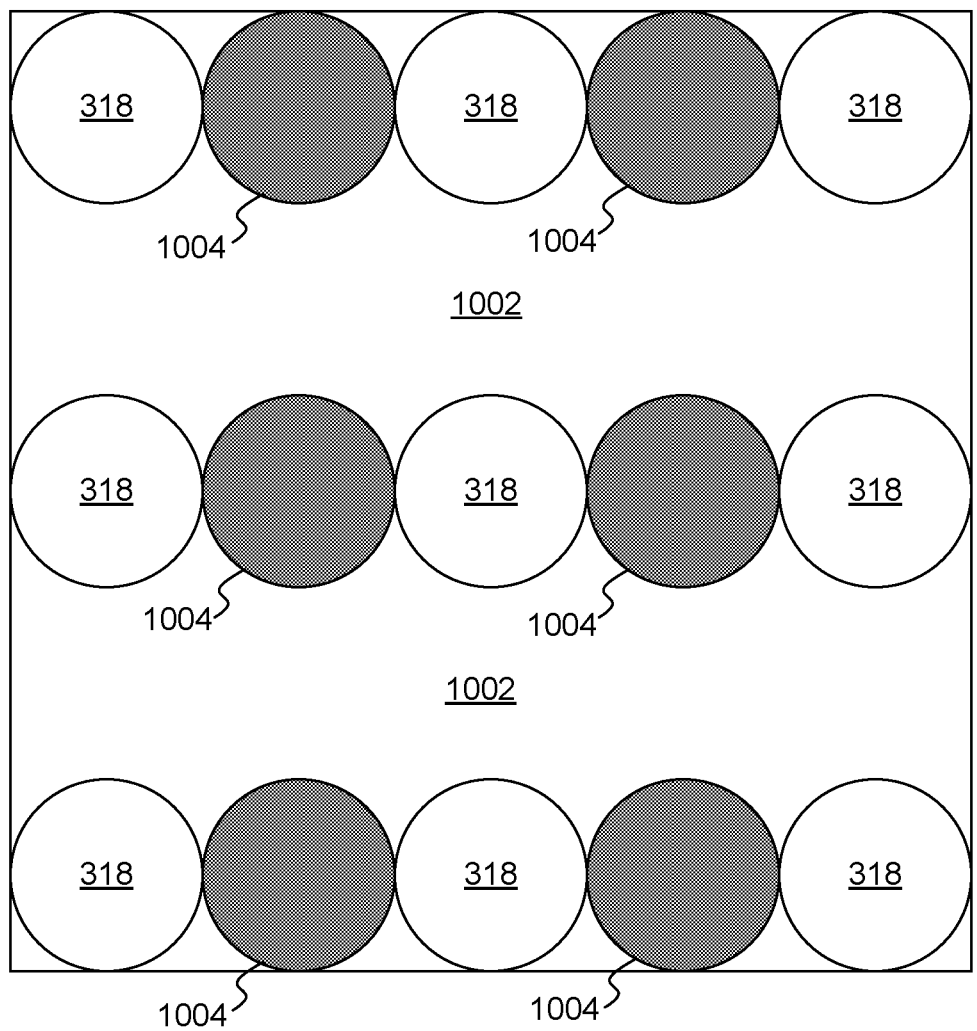
FIG. 5 is a top down view of a patterned mask array after a second patterning step.
Figure 10:
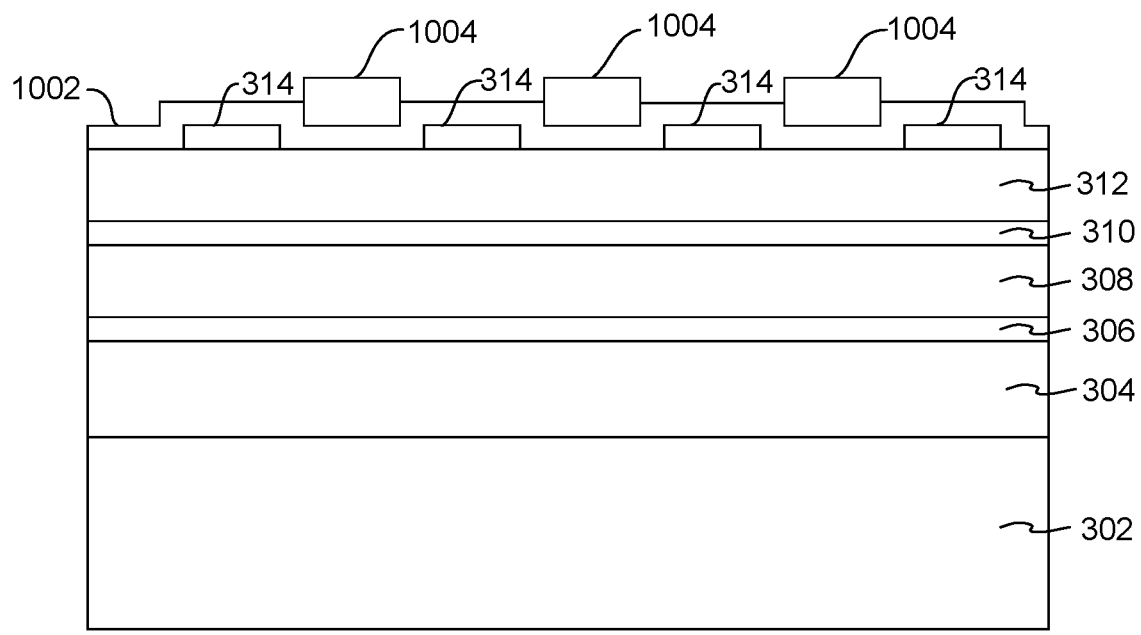
FIG. 10 is a side, cross-sectional view of the series of layers after the second patterning step.
Figure 11:
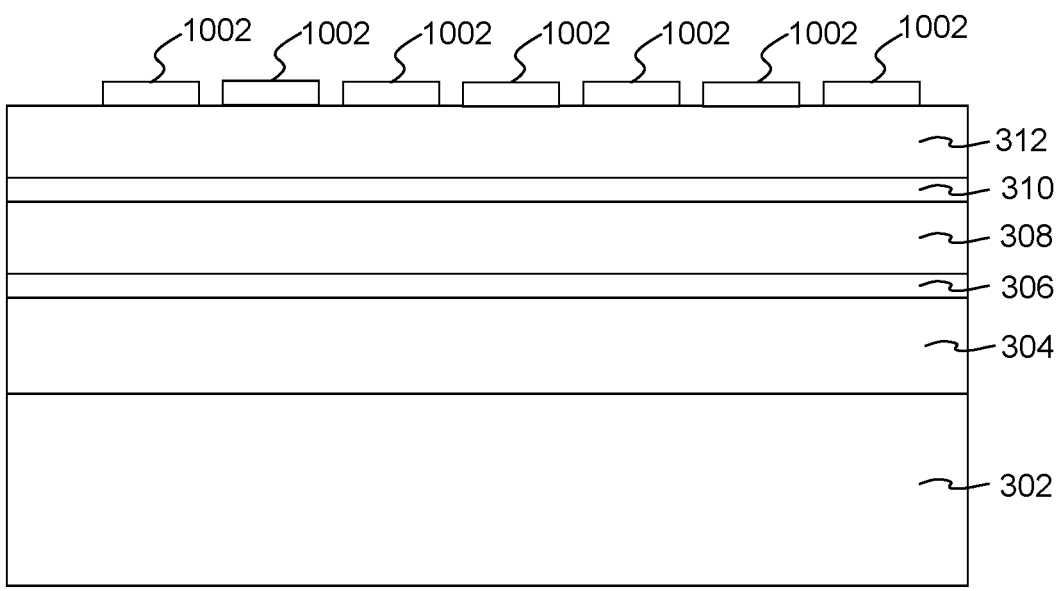
FIG. 11 is a side, cross sectional view of the series of layers after the second patterning step and after removal of a second photoresist mask.

Then, with reference to FIG. 10, another set of planarizing OPL layer and SiN layer of hard mask material 1002, is deposited over the Si 312 and mask 318. Then, a second photoresist mask structure 1004 is formed by depositing a layer of photoresist and then photolithographically patterning and developing the photoresist. This second mask 1004 is patterned to have a configuration as shown in the shaded circles 1004 in FIG. 5, which shows a top down view of the mask 1004. This second patterning can be performed in a stepper tool using the same photomask that was used to perform the previous patterning to form the mask 318 of FIG. 4, by moving the mask and lens laterally (in an "x" direction as shown in FIG. 5). Another etching process can then be performed to transfer the image of the mask 1004 onto the under-lying combined SiN and OPL layers 1002, leaving a structure as shown in FIG. 11 with hard mask structures 1002 being side by side with the earlier formed mask structures 314.

Figure 6:
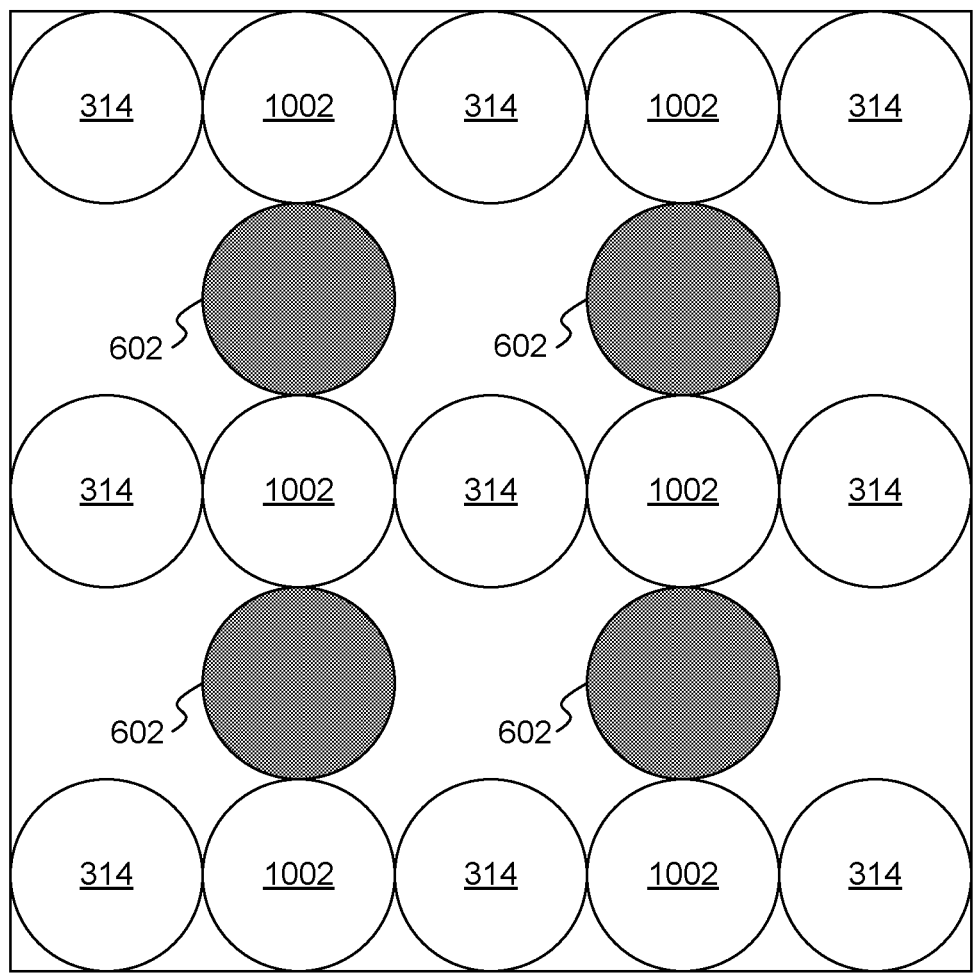
FIG. 6 is a top down view of a patterned mask array after a third patterning step.

Yet another masking and etching process can then be performed. This can include depositing another hard mask set of OPL and SiN layers, forming a photoresist mask and etching to remove hard mask materials not protected by the photoresist mask. The configuration of this third masking process can be seen more clearly with reference to FIG. 6, which shows a top down view. In FIG. 6, the previously formed hard mask structures 314, 1002 are shown side by side. In addition, a third photoresist mask 602 is formed over a hard mask layer. The third mask structure 602 is shown shaded in FIG. 6. As can be seen, the photoresist mask 602 is arranged between the previously formed mask structures 1002. The mask 602 can be formed by a photolighographic process wherein the lens used to define the mask structures 314, 1002 is again used, but it is shifted in the "Y" direction, in a direction perpendicular to the direction used to define mask structures 1004 of FIG. 5. The mask can be shifted in the "Y" direction by a distance that is ½ of the pitch of the previously formed mask structures 314 (or half of the pitch of the mask structures 1002). After the mask 602 is photolithographically formed as described above, an etching process such as reactive ion etching can be performed to transfer the image of the mask 602 onto the underlying hard mask layer 604. The remaining third hard mask structure 602 is shown in FIG. 7.

Figure 7:
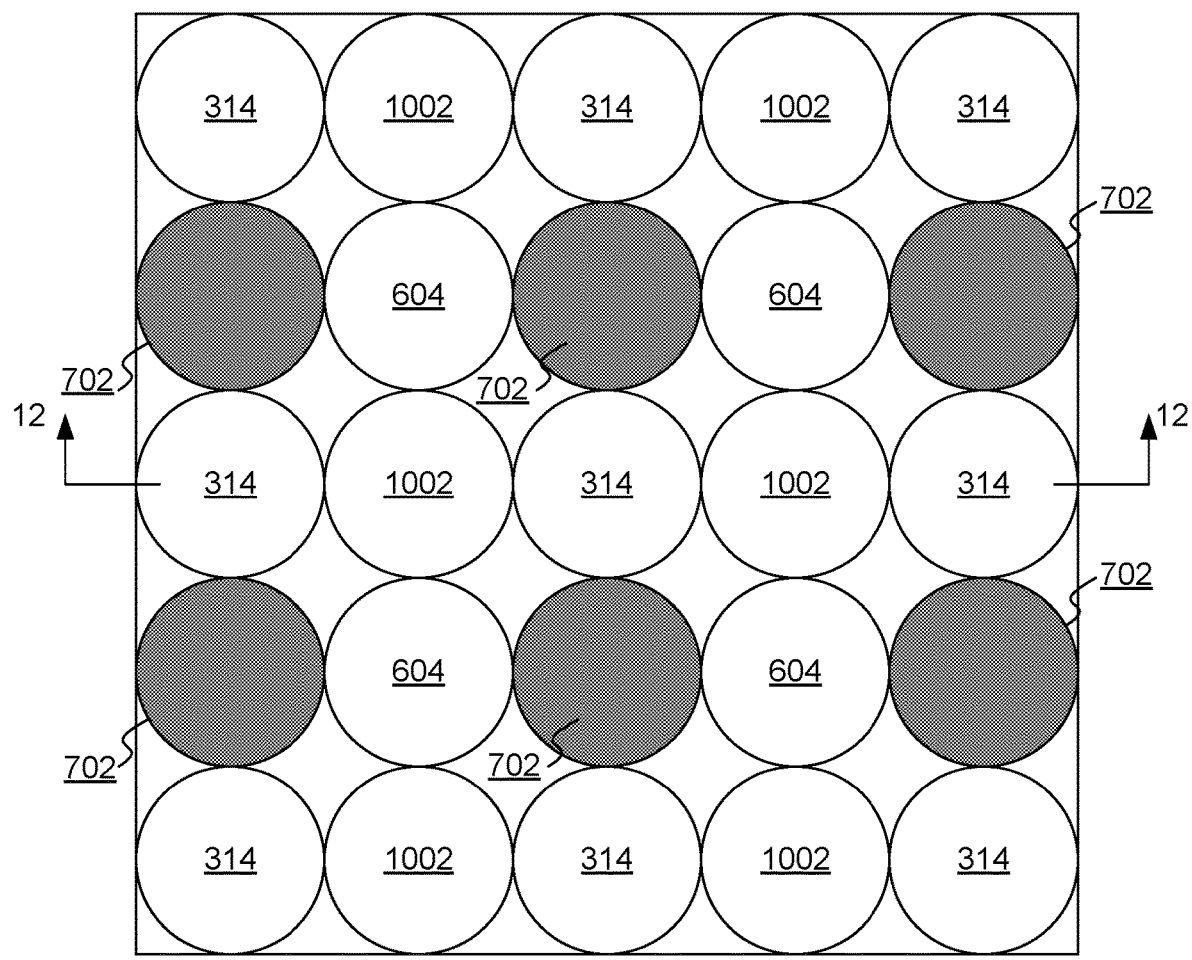
FIG. 7 is a top down view of a patterned mask array after a fourth patterning step.

With continued reference to FIG. 7, a fourth hard mask structure 702 is formed by a similar process shifted in the X direction from the previously performed process. This fourth masking process can include depositing a fourth set of OPL+SiN hard mask layers, forming a fourth photoresist mask using the same lens and mask as the previously three processes, but shifting the photolithograph in the x direction that is ½ of the pitch of the previously formed mask structures. Then another etching process is performed to transfer the image of the photoresist mask onto the underlying set of hard masking layers of OPL and SiN and then removing the photoresist. This leaves the hard mask structure 702 shown in FIG. 7. As can be seen in FIG. 7, the above processes result in an array of mask structures that are very closely packed together. The mask structures 314, 1002, 602, 702 are formed over the previously described silicon layer 312.

An etching process is then performed to remove portions of the silicon layer 312 that are not protected by the masks 314, 1002, 604, 702 thereby transferring the image of the mask structures onto the underlying silicon. This can be seen in FIG. 12, which shows a cross sectional view as seen from line 12, 12 of FIG. 7. After the image of the mask structures has been transferred to the silicon layer 312, the overlying mask structure may optionally be removed or can be left intact over the formed silicon pillars 312.

Figure 12:
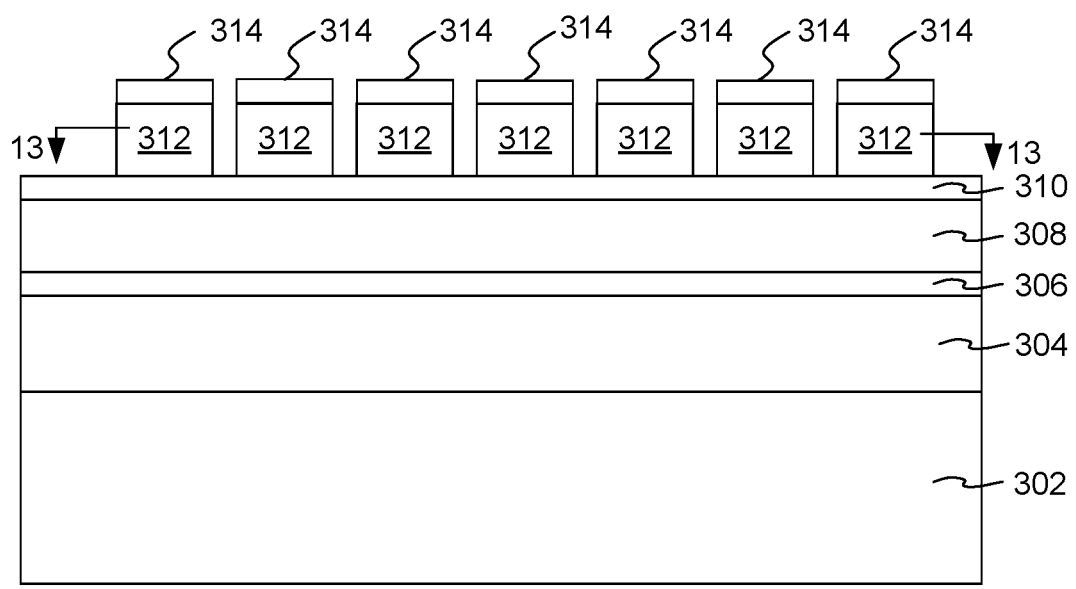
FIG. 12 is a side cross sectional view of the series of layers after etching to form pillars of silicon.
Figure 13:
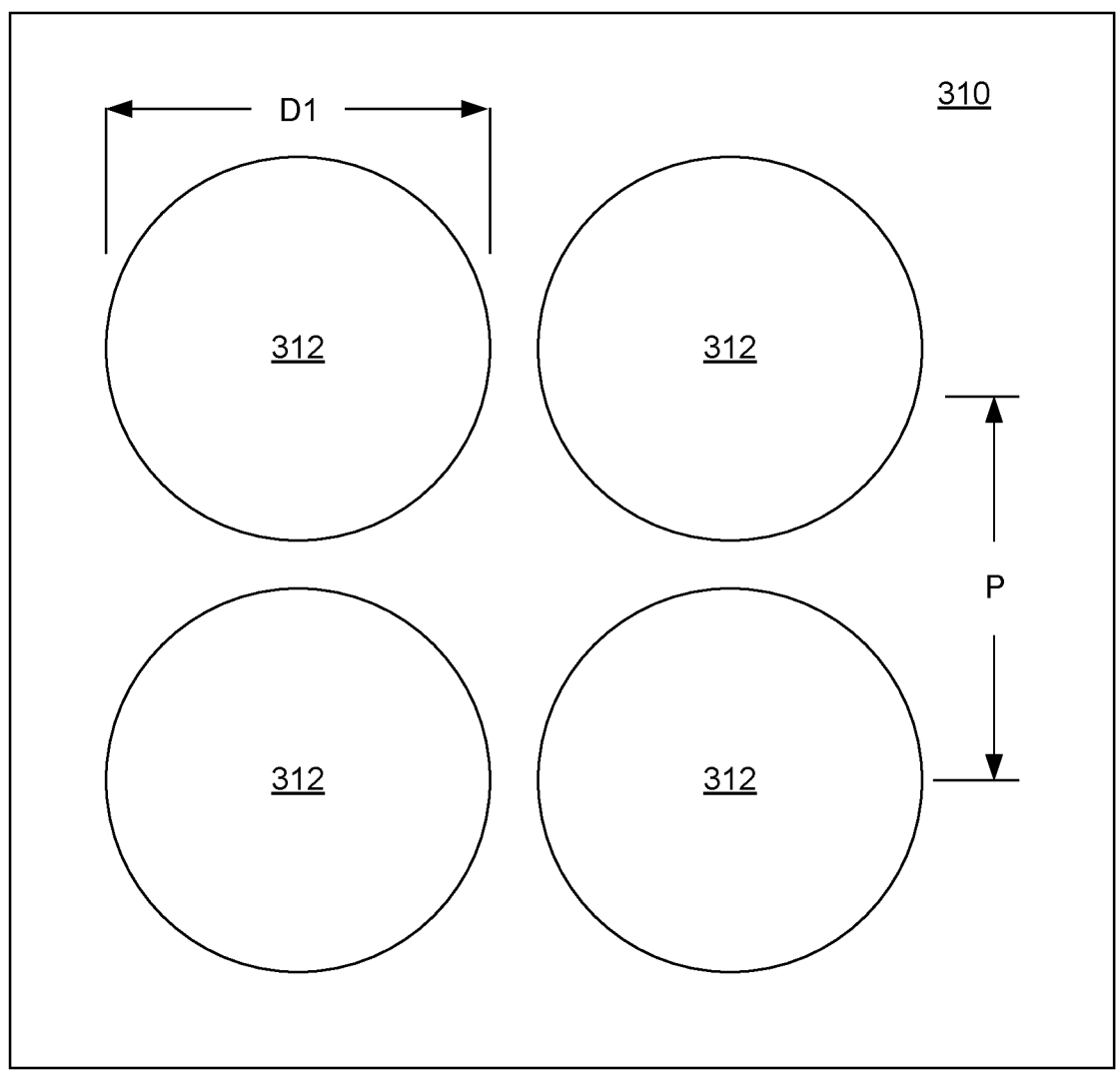
FIG. 13 is a top-down, cross-sectional view taken from line 13-13 of FIG. 12.

FIG. 13 shows a top-down, cross-sectional view as seen from line 13-13 of FIG. 12. In FIG. 13 it can be seen that the previously formed silicon pillars 312 have a diameter D, and a pitch P. Although the above process advantageously results in a close packed array of silicon structures 312 having a very small pitch, in some applications such as magnetic random access memory (MRAM), it is also necessary that a certain minimum spacing be maintained between elements. In the case of an MRAM array, this minimum spacing between memory elements prevents magnetic interference between adjacent elements and also prevents electrical current shunting between elements. Therefore, if the silicon pillars 312 of FIG. 13 were to be used as mask structures to define an array of magnetic memory elements, they could result in a structure which does not provide sufficient spacing between magnetic elements.

Figure 14:
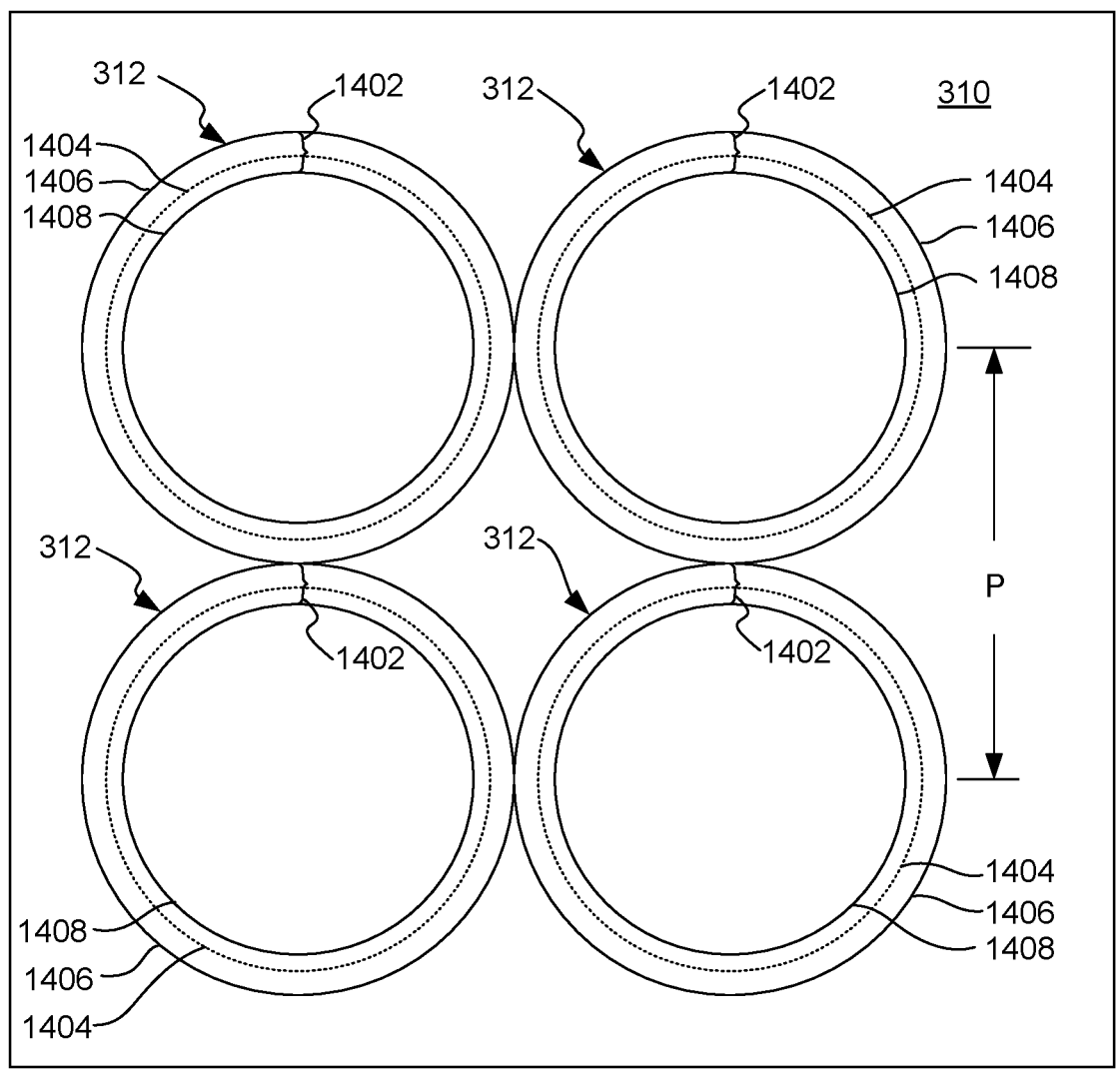
FIGS. 14-20 are top-down cross-sectional views showing the pillars of silicon after a series of oxidation and etching processes to reduce the dimensions of the pillars of silicon.

Below is described a process for reducing the size D of the silicon pillar structures 312 in order to form a mask having very small diameter mask elements, a very small pitch, and which also ensures a desired minimum spacing is maintained between memory elements. In order to reduce the size of the silicon pillars 312 a series of oxidation and etching process are performed. A first oxidation process is performed. The oxidation of the silicon pillars 312 can be performed by exposure to an $O_2$ plasma, which can be performed at room temperature. At this point no photoresist remains over the top of the silicon pillars 312, but the SiN mask layers 312, 1002, 702, 604 (FIGS. 7 and 12) can remain over the tops of the silicon pillars 312. A top-down, cross-sectional view of the silicon pillars 312, after small fraction of silicon oxidation is shown in FIG. 14. As shown in FIG. 14, the oxidation only oxidizes an outer portion of the silicon pillar 312. This oxidized portion is shown as bracketed area 1402. The oxidation rate is diffusion controlled and is self-limiting, exponentially decreasing with time. For example, even after 30 minutes of plasma oxidation, about 7 nm of Si is consumed and is converted to about 15 nm of $SiO_2$.

In FIG. 14, the dashed line 1404 indicates the original outer diameter of the silicon pillar prior to the oxidation process. Outer line 1406 indicates the diameter of the oxidized silicon pillar 1302 after oxidation (including the outer layer of oxide 1404), and the inner circle 1408 represents the inner diameter of the oxidation layer at the junction between oxide (e.g. $SiO_2$) and unoxidized silicon (Si). Because of the size of $SiO_2$ molecule is about 2.2× larger than Si atom, the size of the oxidation region is larger than the pre-oxidized silicon, thus resulting in the slightly larger size of the oxidized pillar 312 as shown in FIG. 14. Note that proper size of Silicon neighboring pillars spacing will be needed for a given amount of oxide growth to prevent the pillars from hitting each other and getting uprooted. In other words, pillar to pillar spacing before the oxidation and the thickness of the oxide grown needs to be engineered carefully.

Figure 15:
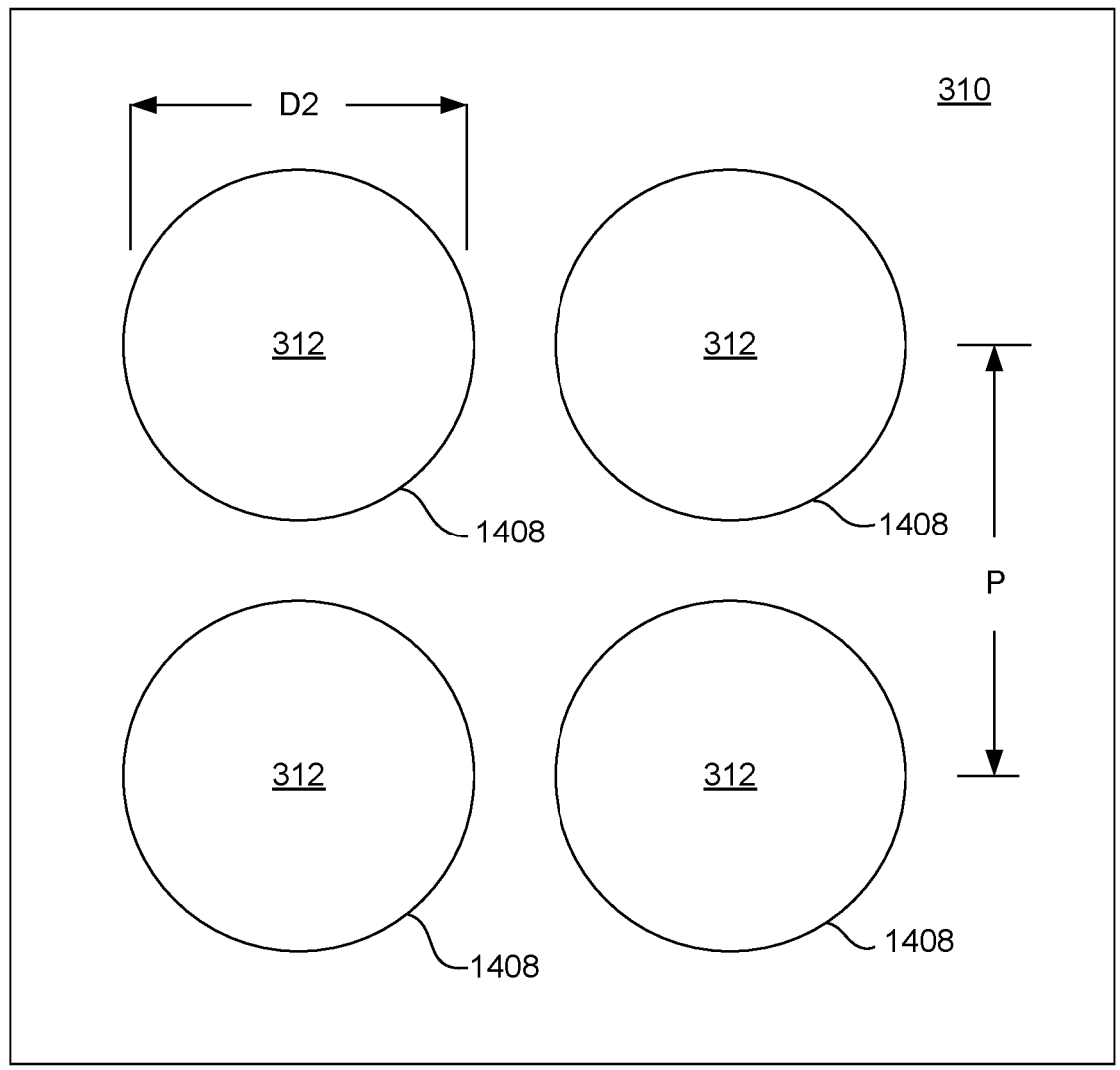
Figure 16:
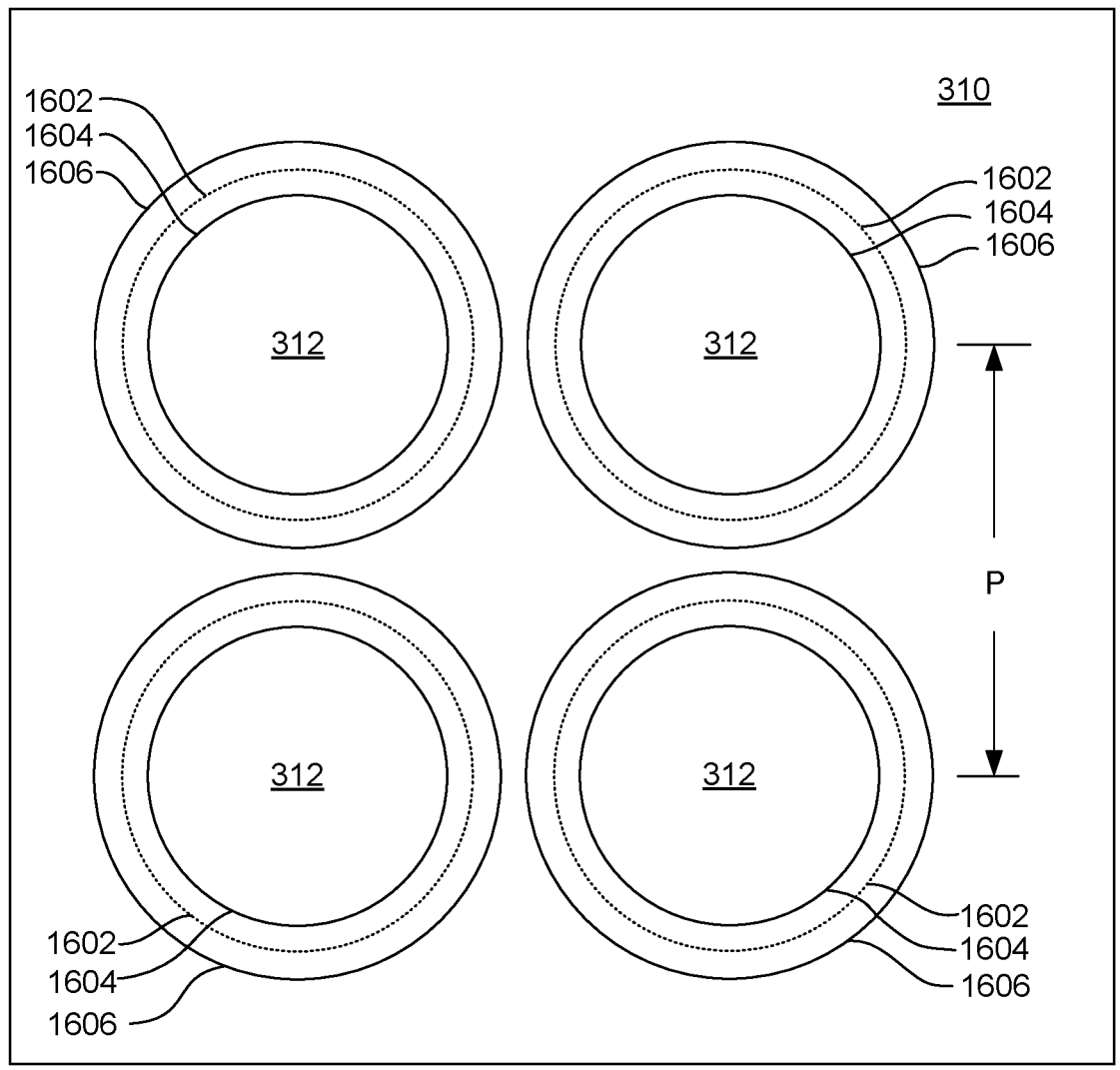
Figure 17:
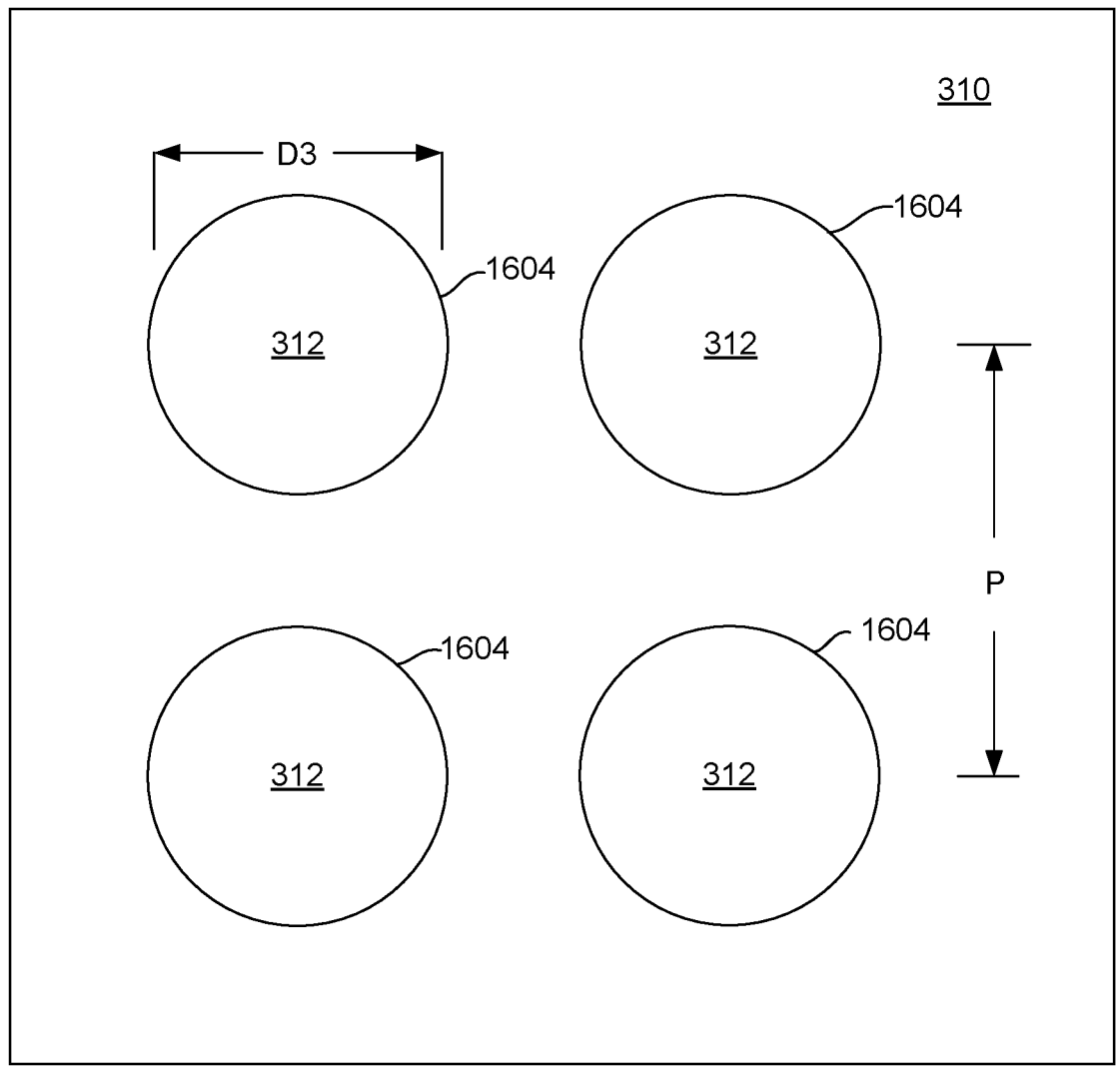

After the first oxidation process has been performed, an etching process can be performed to remove only the oxidized portion of the silicon and leaving the un-oxidized Si. The etching performed to remove the oxide layer can be a gas phase etch in a chemistry of anhydrous HF. This etching process is selective to remove silicon oxide while leaving the inner Si intact. This reduces the size of the pillars 312 to the inner diameter line 1408, leaving a Si pillar 312 having a reduced diameter as shown in FIG. 15. The oxidation process is repeated leaving as structure as shown in FIG. 16, wherein the dashed circle 1602 represents the diameter of the Si pillar 312 before the second oxidation process, circle 1604 represents the outer diameter of un-oxidized Si and the circle 1606 represents the outer diameter of the oxidation layer. Again, another etching process can be performed to remove the oxide layer, leaving a Si pillar 312 having a further reduced outer diameter 1604 as shown in FIG. 17.

Figure 18:
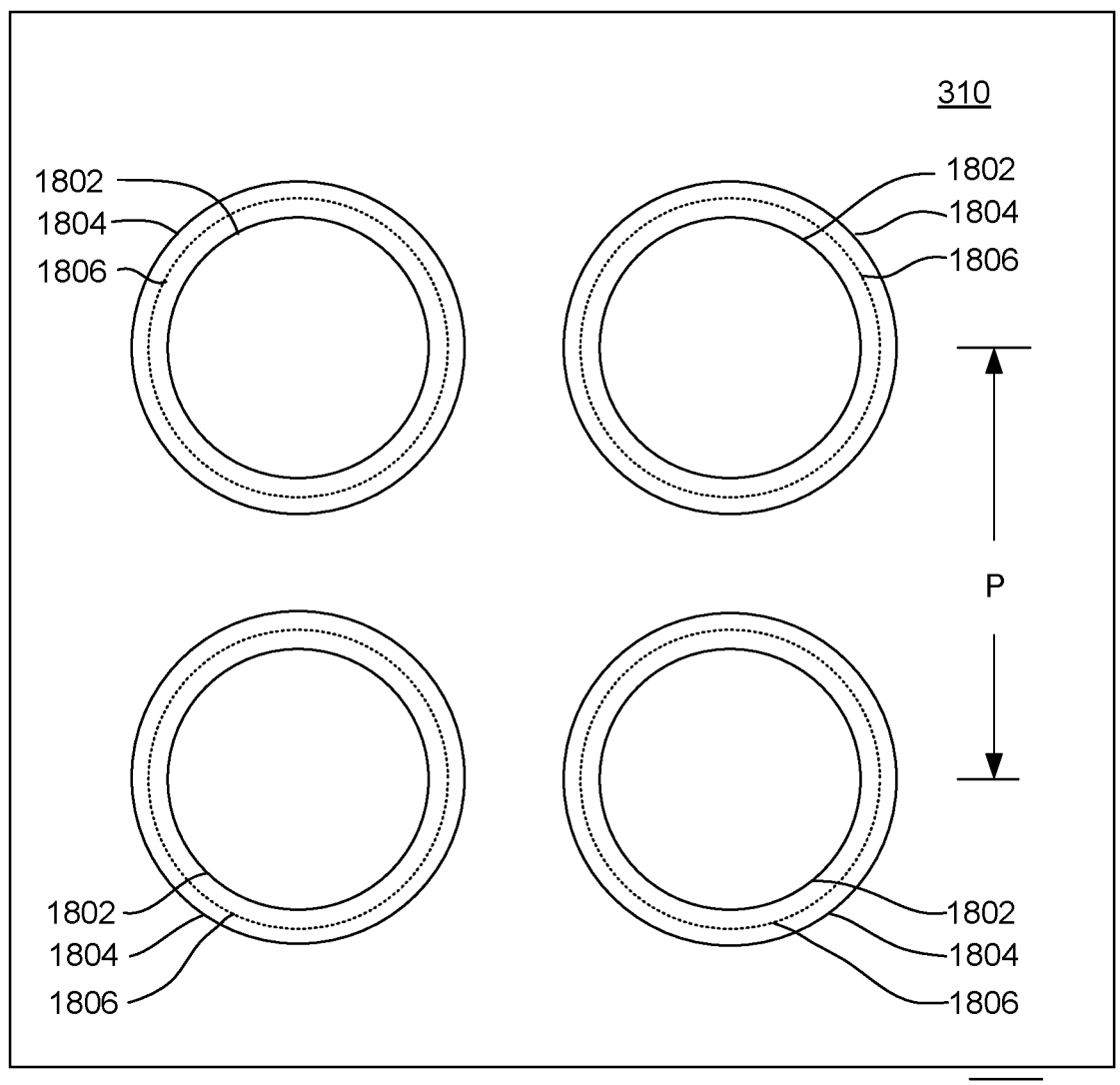
Figure 19:
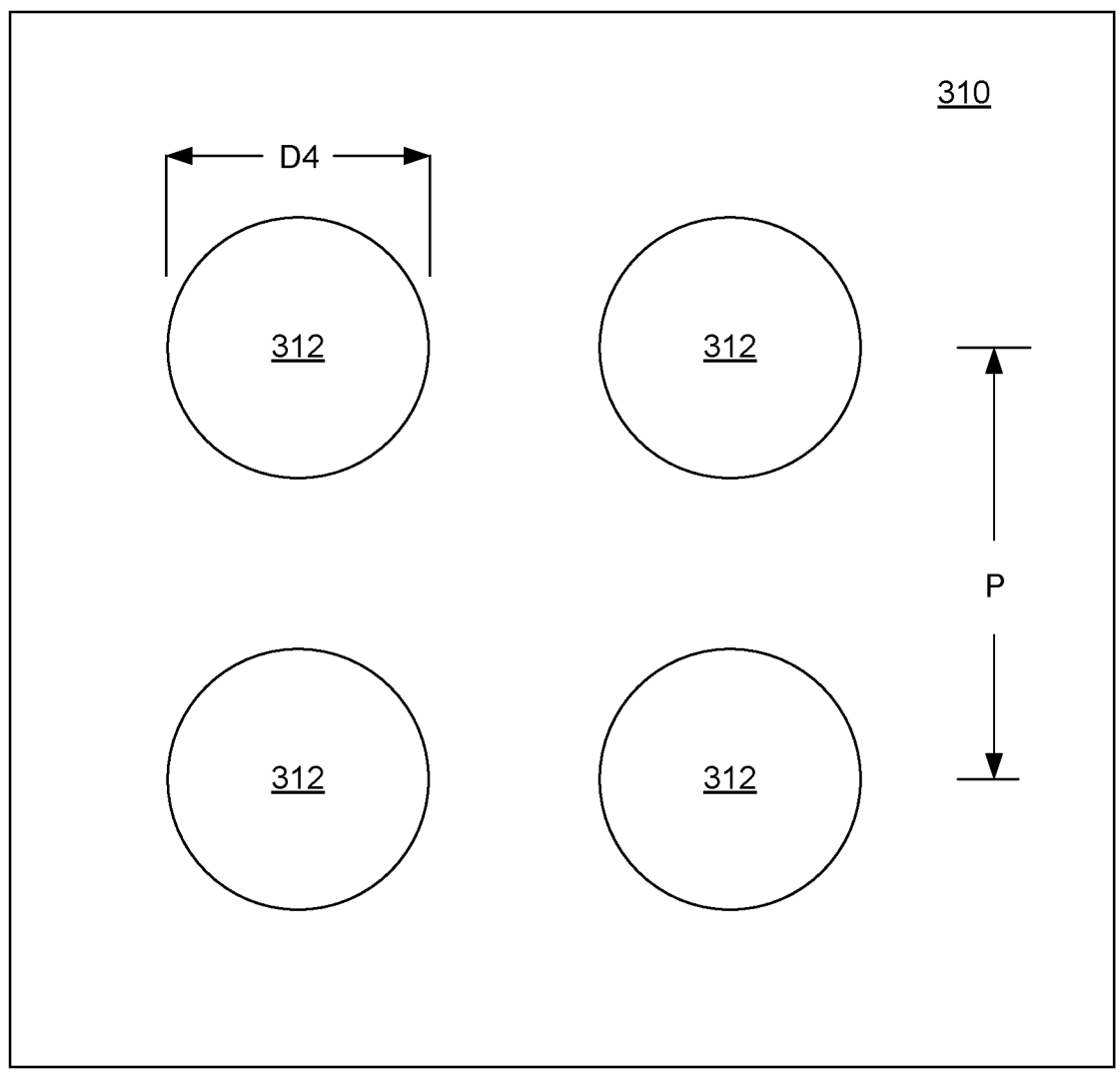
Figure 20:
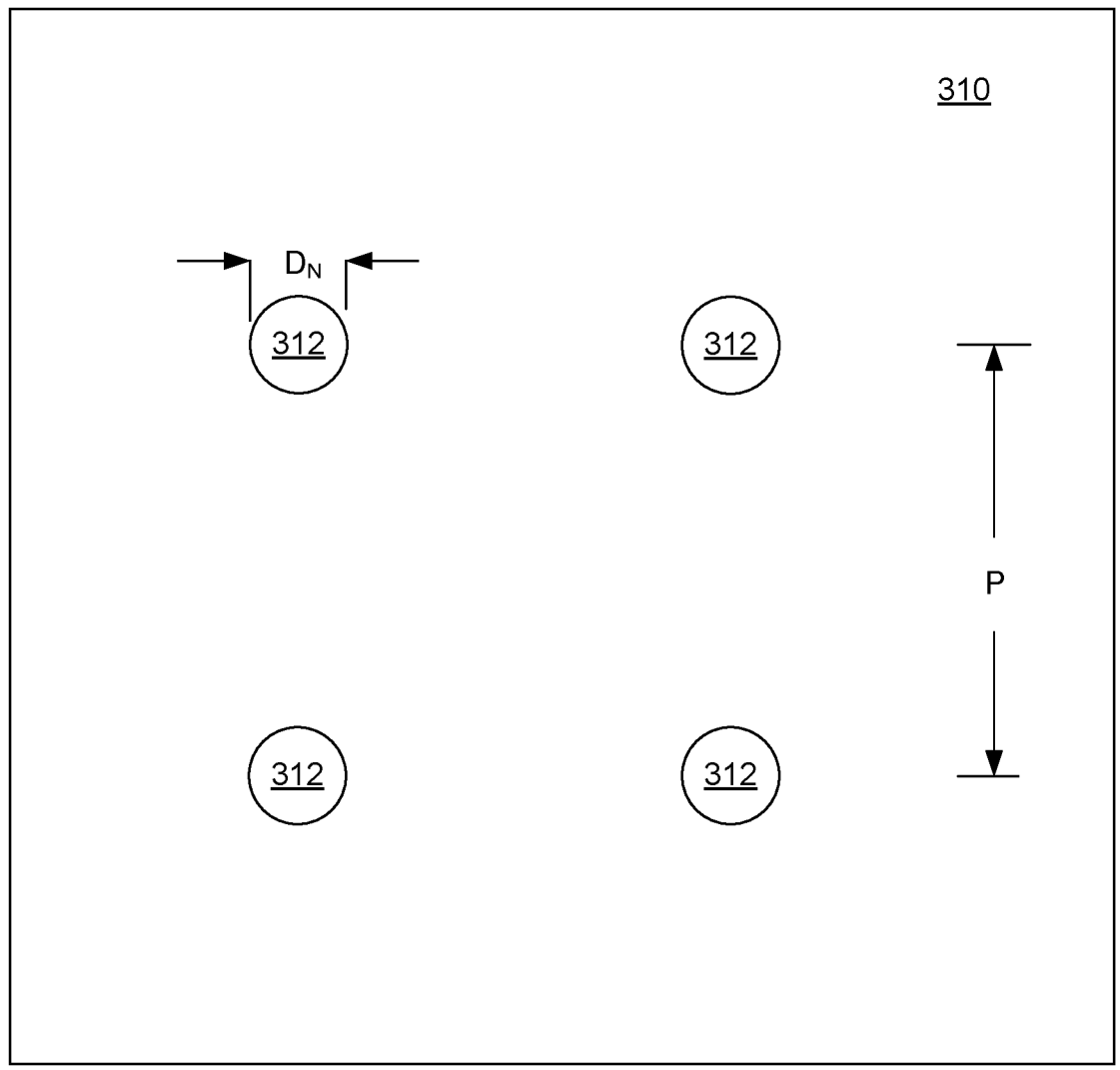
Figure 21:
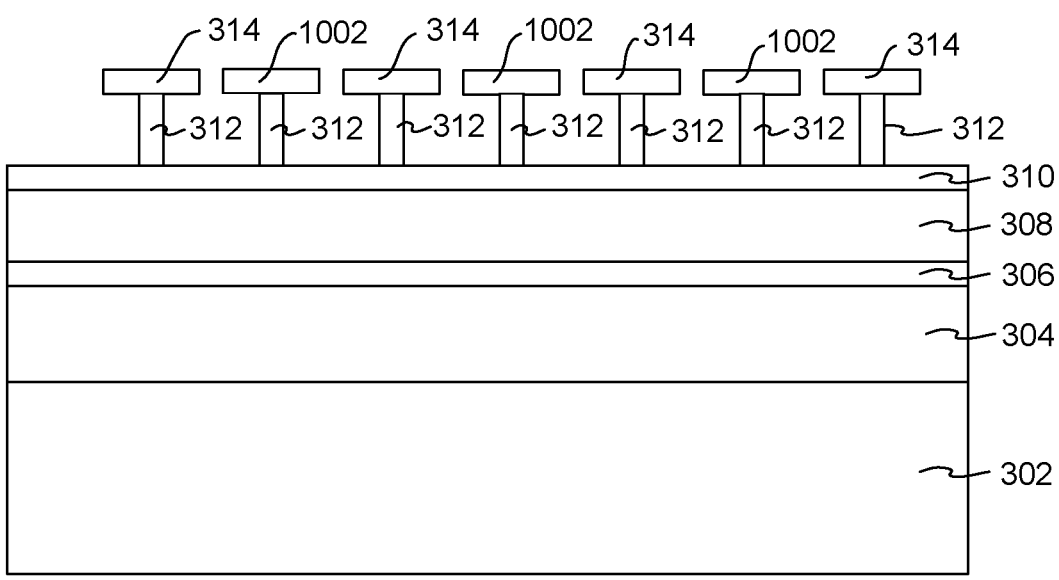
FIGS. 21-26 are side, cross-sectional views illustrating the use of narrow silicon pillars as mask structures to form small dimension pillar structures.

This oxidation process can be repeated as shown in FIG. 18, forming a further reduced diameter Si portion surrounded by an oxide (i.e. $SiO_2$). Again, the previous diameter from FIG. 17 is shown as dashed line 1806. Another etching process is again performed to remove the outer oxide 1804, leaving a further narrowed structure as shown in FIG. 19. This process of oxidation and etching is repeatedly performed until the Si pillar 312 has a sufficiently small diameter that the final oxidation process oxidizes the entire pillar structure 312, leaving a pillar 312 of oxide ($SiO_2$) having a very small diameter as shown in FIG. 20. In an exemplary embodiment, the Si pillar 312 can have a diameter of only 10 nm prior to the final oxidation, whereas the original diameter of the Si pillar structures 312 prior to oxidation and etching was 40 nm. In this exemplary embodiment, the final oxidation will increase the final diameter of the pillar 312 from a diameter of about 10 nm to a diameter of 22 nm, thereby leaving a 22 nm diameter pillar 312 which can be used as a hard mask for forming very small structures as will be described herein below. FIG. 21, shows a side cross sectional view of the oxide mask structures 312. As can be seen, the previously formed SiN hard mask structures (shown as 314, 1004 in FIG. 21, and also including mask structures 604, 702 as shown in FIG. 7) can be left intact throughout the previously described oxidation and etching processes. This ensures that the processes of oxidation and etching to remove oxidation reduces the diameter of the pillar structures 312 without reducing the height of the pillar structures 312.

Figure 22:
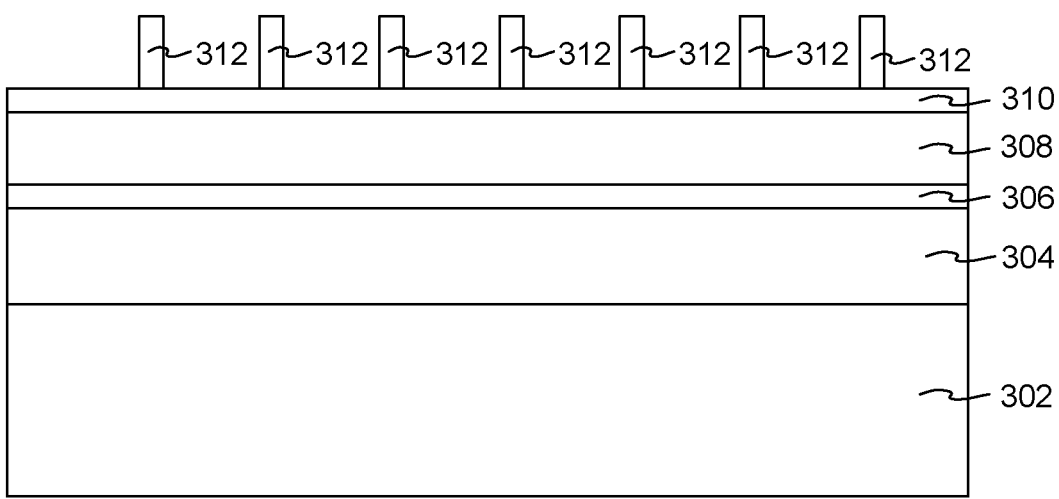
Figure 23:
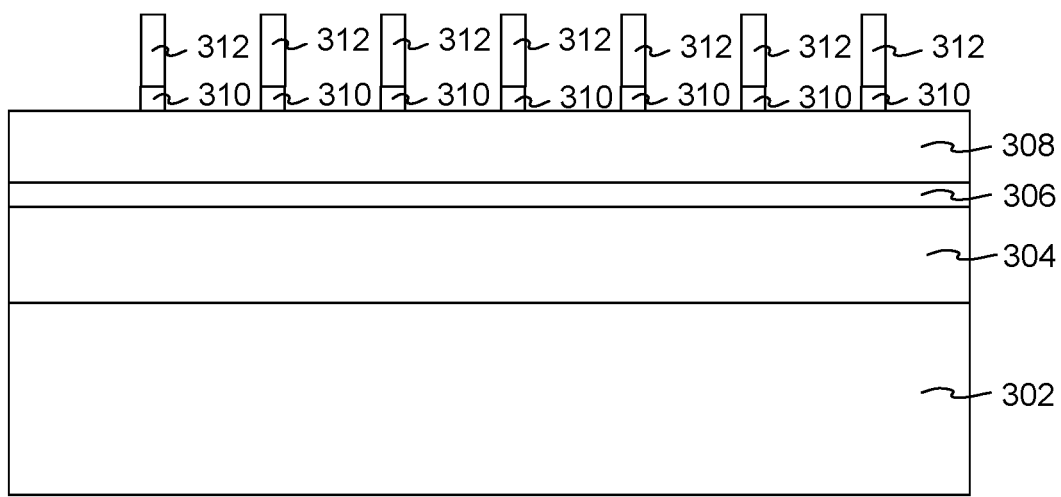

After the above processes have been performed, the hard mask layers 314, 1004, 604 702 can be removed by a selective plasma dry etching process which removes the hard mask material and not the oxidized pillar itself. This operation will leaves a structure such as that shown in FIG. 22. This process can also remove portions of the optional underlying TaN layer 306, leaving a structure such as that shown in FIG. 23. The optional TaN layer 310 can be useful as an etch stop layer to protect the underlying layer 308 from the previously described etching processes that were used to remove the silicon oxide to shrink the diameter of the pillars 312.

Figure 24:
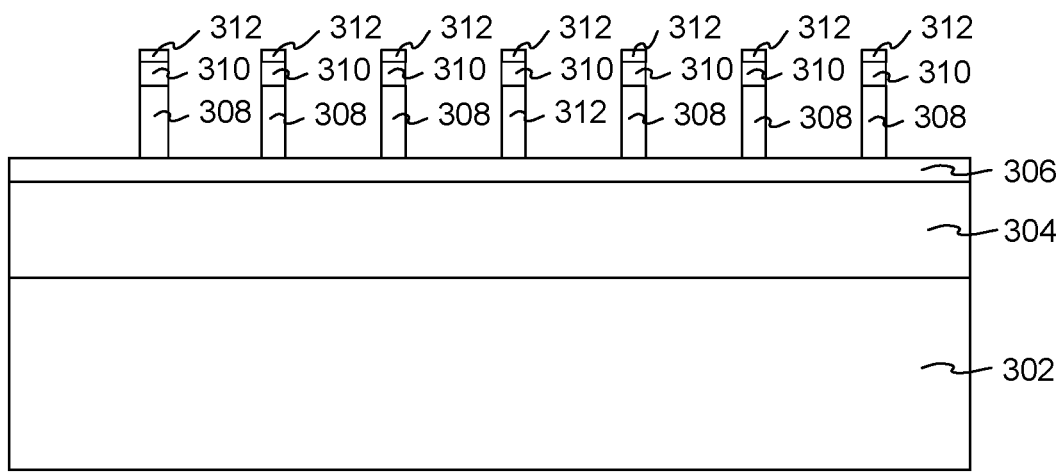

After forming the narrow oxide pillars 312 by the processes described above, the silicon oxide pillars 312 can be used as a hard mask to pattern the TaN hard mask layer 308. An etching process such as reactive ion etching RIE can be performed, no need to tell them, which has a good selectivity for removing TaN. Such an etching process can advantageously remove portions of the TaN 308 that are not protected by the silicon oxide hard mask 312, resulting in a structure such as that shown in FIG. 24. An optional Ru layer 306 can be used as an etch stop layer during this etching process.

Figure 25:
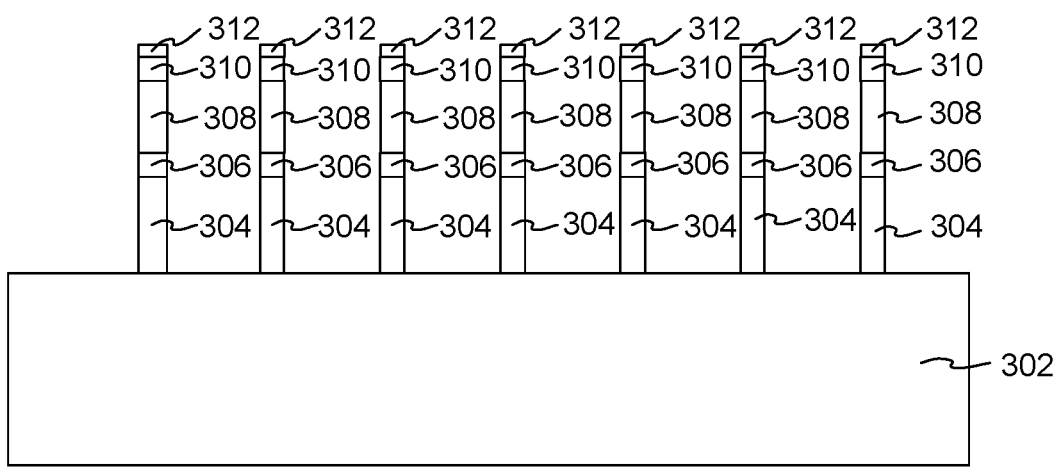

The above process results in a hard-mask structure 308 having very small features sizes a close packed small pitch and a desired minimum spacing between feature elements. With the hard mask 308 patterned as described above, a dry etching process such as reactive ion etching can be performed to remove portions of the underlying etch stop layer 306 and layer 304, thereby transferring the image of the hard-mask 308 onto the underlying layer 304, thereby leaving a structure as shown in FIG. 25. The dry etching process is preferably a reactive ion etching process using a chemistry that is chosen having a selectivity of the material of the layers 304, 306 so as to preferentially remove the layers 304, 306, while leaving the hard-mask 308 substantially intact.

In a particular useful embodiment, the layer 304 can be a series of layers making up a tunnel junction sensor such as can be used in a Magnetic Random Access Memory array. For example, the layer 304 can include multiple layers useful in forming a structure such as the memory element structure 100 of FIG. 1.

Figure 26:
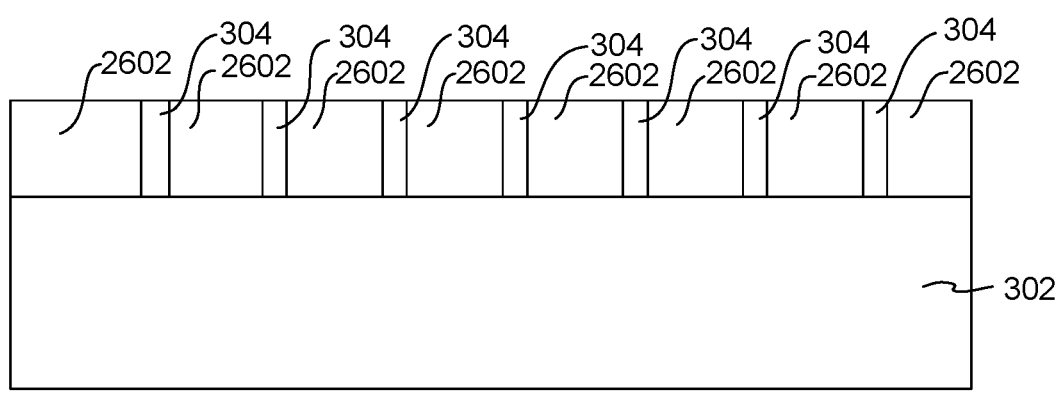

After the layer 304 has been formed as described, an isolation layer 2602 can be deposited and a chemical mechanical polishing process (CMP) can be performed, resulting in a structure such as that shown in FIG. 26. The isolation layer 2602 can be one or more layers of a non-magnetic, dielectric material.

The above described process provides the ability to form an array of pillar structures having an extremely small diameter far below the resolution limits of available photolithographic processes. This array of small features size pillar structures can also be advantageously formed at a very small pitch while also maintaining a desired minimum spacing between elements.

Figure 27:
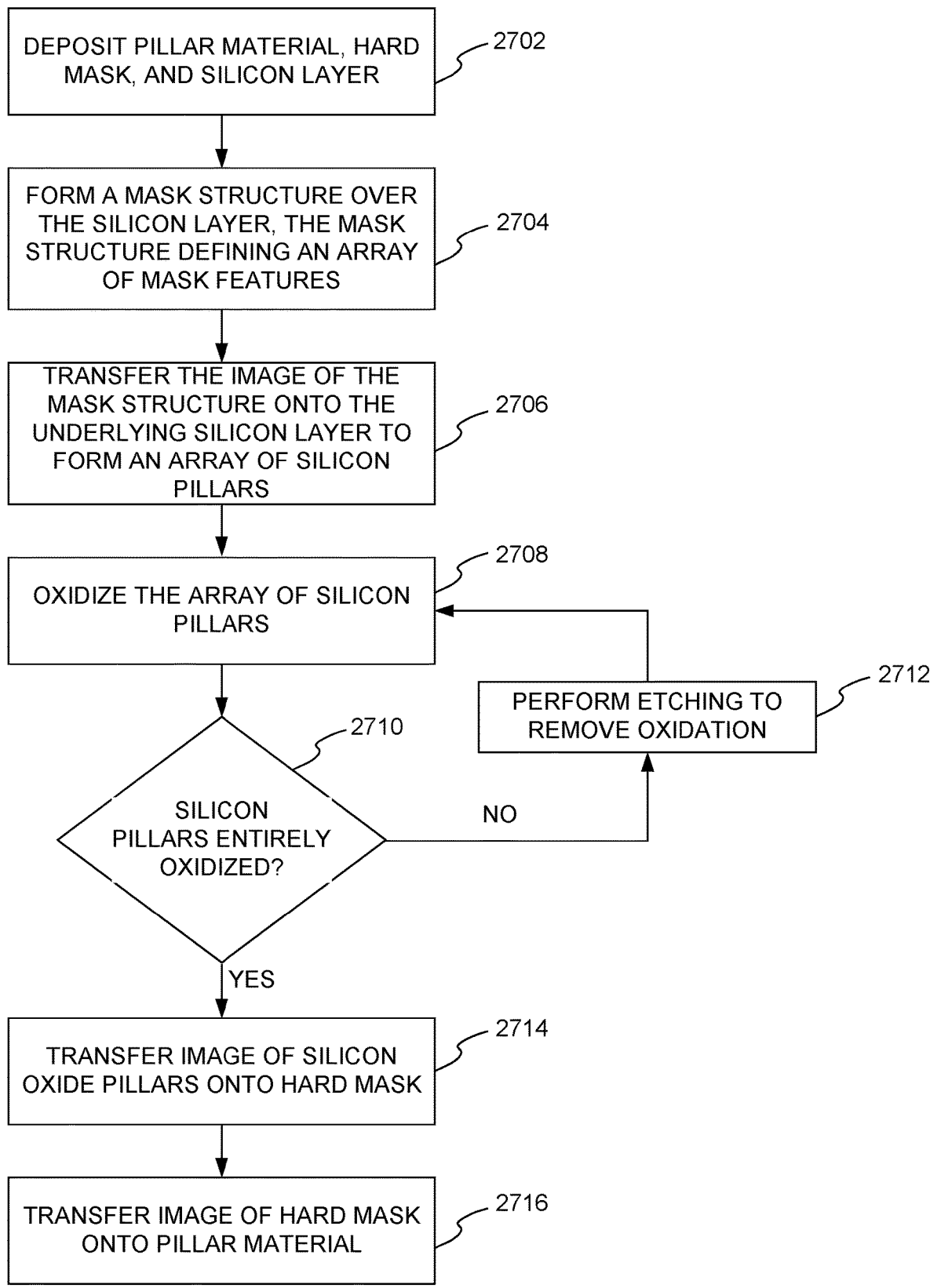
FIG. 27 is a flowchart illustrating a method for manufacturing an array of small features size pillar structures, such as an array of magnetic memory element pillar structures.

FIG. 27 shows a flowchart summarizing an example of a process for manufacturing an array of very small diameter pillar elements. In a step 2702, a pillar material is deposited, followed by a hard mask layer and a silicon layer. In one possible embodiment, the pillar material can be a series of layers configured to construct a magnetic memory element such as a perpendicular magnetoresistive tunnel junction (pMTJ) element. The hard mask layer can be a layer of material such as TaN.

Then, in a step 2704 a mask structure is formed over the silicon layer. Mask can be configured to define an array of pillar structures. The mask structure can be formed by photolithographically patterning a photoresist material and transferring the image of the patterned photoresist onto an underlying etch mask or hard mask layer such as SiN. A very close packed array of mask elements can be formed by multiple masking and image transfer steps in a process in which several photolithographic patterning and image transfer steps are shifted relative to a previous photolithographic patterning and image transfer step.

Then, in a step 2706, the image of the formed mask structure is transferred onto the underlying silicon layer. This process can be performed by performing an etching such as reactive ion etching to remove portions of the silicon layer that are not protected by the previously formed mask structure.

Then, in a step 2708, an oxidation is performed to oxidize the patterned silicon layer. The oxidation can be performed by plasma oxidation. At this point, the hard mask portion (e.g. SiN) of the mask structure can remain over the top of the silicon layer, so that the oxidation step only oxidizes the silicon pillars from the outer diameter inward.

In a decision step 2710, a determination is made as to whether the silicon pillars have been entirely oxidized by the previous oxidation step. If they have not been entirely oxidized (e.g. leaving an outer layer of oxidation and a remaining Si inner portion) then the outer oxide portion is removed in a step 2712. This removal of the oxide layer can be performed by a gas phase etch. If the previously performed oxidation has entirely oxidized the silicon pillars, leaving an array of silicon oxide pillars, then the process can continue to step 2714 where the image of the remaining silicon oxide pillars is transferred onto the underlying hard mask. This can be performed by a dry etching process such as reactive ion etching. Then, in a step 2716, the image of the patterned hard-mask can be transferred onto the underlying pillar material. This leaves a close packed array of pillars having very small feature size.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A method for manufacturing an array of pillar structures, the method comprising:
    depositing a pillar material over a substrate;
    depositing a layer of silicon over the pillar material;
    forming a mask structure over the layer of silicon, the mask structure including an array of patterned features;
    performing material removal process to transfer the pattern of the mask structure onto the underlying layer of silicon to form an array of silicon pillar structures;
    oxidizing the silicon pillar structures to form an outer oxide layer on the silicon pillar structure;
    etching the silicon pillar structures to remove the oxide layer, thereby reducing the size of the silicon pillar structure; and
    using the reduced size pillar structure as a mask to pattern the underlying pillar material.

2. The method as in claim 1, wherein the processes of oxidizing the silicon pillar structures and performing an etching to remove the oxide layer is repeatedly performed until the final oxidation oxidizes the entire silicon pillar structure, leaving an array of silicon oxide structures.

3. The method as in claim 2, using the array of silicon oxide structures as a mask to form the pillar material layer into an array of pillar structures.

4. The method as in claim 3, wherein the array of pillar structures is formed by performing an etching process to remove portions of the pillar material.

5. The method as in claim 1, wherein the pillar material comprises a plurality of layers arranged to form a magnetic memory element.

6. The method as in claim 1, wherein the pillar material comprises a plurality of layers arranged to form a magnetic tunnel junction structure.

* * * * *